(12) United States Patent
Oates

(10) Patent No.: US 6,781,855 B1
(45) Date of Patent: Aug. 24, 2004

(54) POWER DIVERTER

(75) Inventor: Daniel E. Oates, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/317,925

(22) Filed: Dec. 12, 2002

(51) Int. Cl.[7] ................................................ H03H 7/20
(52) U.S. Cl. .................... 363/142; 333/139; 327/586
(58) Field of Search .......................... 363/142; 333/164, 333/139; 327/586, 237

(56) References Cited

U.S. PATENT DOCUMENTS

| | | | |
|---|---|---|---|
| 5,373,299 A | * 12/1994 | Ozaki et al. | ................ 342/373 |
| 5,939,939 A | * 8/1999 | Gaynor et al. | .......... 330/124 R |
| 5,990,761 A | * 11/1999 | Hamparian et al. | ......... 333/164 |

* cited by examiner

*Primary Examiner*—Bao Q. Vu
(74) *Attorney, Agent, or Firm*—Daly, Crowley & Mofford, LLP

(57) ABSTRACT

A power diverter is presented. The power diverter includes a first ninety degree hybrid having one output coupled to a positive adjustable phase shifter and another output coupled to a negative adjustable phase shifter providing a negative phase shift. The value of the phase shift provided by the positive phase shifter and the negative phase shifter is the same amount of degrees but opposite. A second ninety degree hybrid combines the outputs of the phase shifters. The circuit is provided comprising only analog linear components such that no spurious signals are introduced, and the circuit is impedance matched on all ports such that no degradation of noise figure is introduced. The power diverter can also be configured as a programmable tap of a delay line.

9 Claims, 2 Drawing Sheets

POWER DIVERTER

STATEMENTS REGARDING FEDERALLY SPONSORED RESEARCH

This invention was made with government support under Contract No. F19628-00-C-0002 awarded by the U.S. Air Force. The government has certain rights in the invention.

CROSS REFERENCE TO RELATED APPLICATIONS

Not Applicable.

1. Field of the Invention

The present invention relates generally to power diverters and more specifically to an adjustable two-input power diverter that provides unitary transformation of two input signals thereby conserving total power.

2. Background of the Invention

Fixed power dividers are known in the art. A power divider typically is used to divide an input signal into two output signals which are equal or unequal. A programmable or adjustable power divider (hereinafter called a power diverter) may be used as part of an adaptive nulling system. Present power diverters include active circuitry or attenuators, which lead to spurious signal generation or degradation of noise figure. It would, therefore, be desirable to provide a power diverter that does not introduce spurious signals and which does not provide a degradation of noise figure.

SUMMARY OF THE INVENTION

A power diverter is presented. The power diverter includes a first ninety-degree hybrid having one output coupled to an adjustable positive phase shifter and another output coupled to a negative adjustable phase shifter. The outputs of the phase shifters are provided to an output ninety-degree hybrid. The absolute value of the phase shift provided by the positive phase shifter and the negative phase shifter is the same. The circuit can be provided comprising only analog linear components such that no spurious signals are introduced, and the circuit is impedance matched on all ports such that no degradation of noise figure is introduced. The power diverter can also be configured as a programmable tap of a delay line. The circuit also preserves total power.

BRIEF DESCRIPTION OF THE DRAWINGS

The invention will be more fully understood from the following detailed description taken in conjunction with the accompanying drawings, in which.

DETAILED DESCRIPTION OF THE INVENTION

Figure 1:
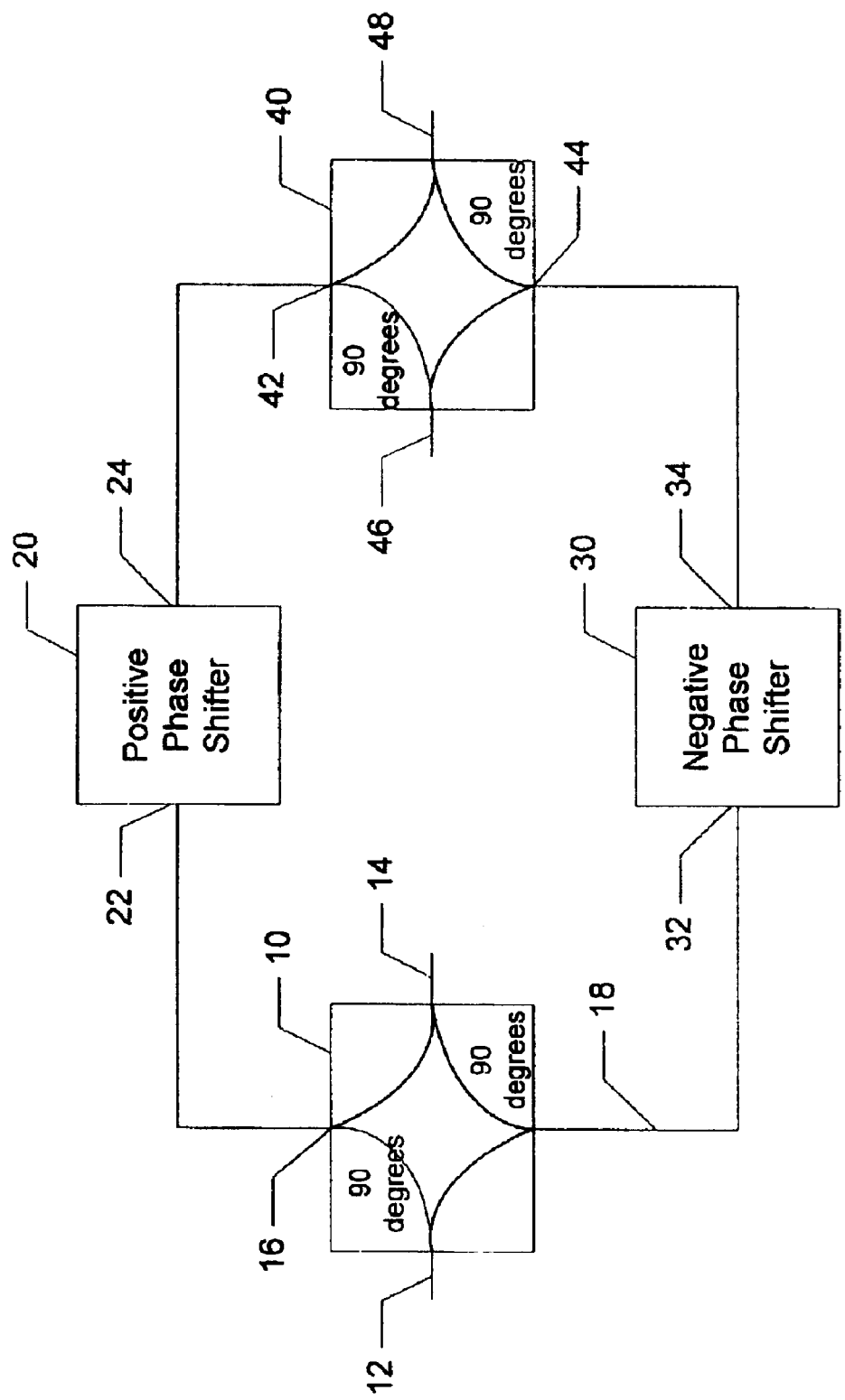
FIG. 1 is a block diagram of the power diverter of the present invention.

Referring to FIG. 1, a block diagram of the power diverter 1 of the present invention is shown. The power diverter 1 comprises an input ninety degree hybrid 10, a positive phase shifter 20, a negative phase shifter 30 and an output ninety degree hybrid 40.

The input ninety degree hybrid 10 has a first input port 12 and a second input port 14. The signal entering first input port 12 of hybrid 10 is split equally in power between a first output port 16 and a second output port 18. The output at port 16 is shifted 90° from the output at port 18. Similarly, the signal entering the second input port 14 of hybrid 10 is also split between the first output port 16 and the second output port 18 and shifted in phase by 90°. The resulting output signal at port 16 contains components of both input signals, and the resulting output signal at port 18 contains components of both input signals.

The signal at the first output port 16 of hybrid 10 is supplied to input port 22 of positive phase shifter 20. Phase shifters provide a shift in the phase of a sinusoidal input, while maintaining the amplitude. The input signal provided to the positive phase shifter is shifted positively by an adjustable number of degrees $\phi$ and is provided at the output port 24.

The signal at the second output port 18 of hybrid 10 is supplied to input port 22 of negative phase shifter 30. The input signal to the negative phase shifter is shifted negatively by an adjustable number of degrees $-\phi$ and is provided at the output port 24. The amount of negative phase shift provided by phase shifter 30 is the same as the amount of positive phase shift provided by phase shifter 20, that is $|\phi|$ is the same value for each phase shifter.

The output provided by phase shifter 20 is provided to a second ninety degree hybrid 40. Second hybrid 40 has a first input port 42 for receiving the output of positive phase shifter 20. Second hybrid 40 has a first output port 46 and a second output port 48. The signal provided by phase shifter 20 to the input port 42 of second hybrid 40 is split equally in power between the output ports 46 and 48. The output at port 46 is shifted 90° from the output at port 48.

The output provided by phase shifter 30 is also provided to second ninety degree hybrid 40. Second hybrid 40 has a second input port 44 for receiving the output of negative phase shifter 30. The signal provided by phase shifter 30 to the input port 44 of second hybrid 40 is split equally in power between output ports 46 and 48. The output at port 46 is shifted 90° from the output at port 48. The power diverter provides for the unitary transformation of the two input signals.

A signal (time variation of $e^{j\omega t}$ is assumed for all signals) $a_1$ applied to the first input port 12 of the first hybrid 10 results in an output signal at output port 16 of:

$$\frac{a_1}{\sqrt{2}}$$

and results in an output signal at output port 18 of:

$$\frac{-ja_1}{\sqrt{2}}$$

A signal $a_2$ applied to input port 14 of the first hybrid 10 results in an output signal at output port 16 of:

$$\frac{-ja_2}{\sqrt{2}}$$

and results in an output signal at output port 18 of:

$$\frac{a_2}{\sqrt{2}}$$

The resulting signal at output port 16 is thus:

$$\frac{a_1}{\sqrt{2}} - \frac{ja_2}{\sqrt{2}}$$

and the resulting signal at output port 18 is:

$$\frac{-ja_1}{\sqrt{2}} + \frac{a_2}{\sqrt{2}}$$

The signal at output port 16 is supplied to the input port 22 of positive phase shifter 20. Phase shifter 20 introduces a positive phase shift of $\phi$ into the signal, resulting in a signal at the output port 24 of:

$$\frac{a_1}{\sqrt{2}}e^{j\phi} - \frac{ja_2}{\sqrt{2}}e^{j\phi}$$

The signal at output port 18 is supplied to the input port 32 of negative phase shifter 30. Phase shifter 30 introduces a phase shift of $-\phi$ into the signal, resulting in a signal at the output port 34 of:

$$-\frac{ja_1}{\sqrt{2}}e^{-j\phi} + \frac{a_2}{\sqrt{2}}e^{-j\phi}$$

The signal at port 24 of phase shifter 20 is supplied to input port 42 of hybrid 40, and the signal at port 34 of phase shifter 30 is supplied to input port 44 of hybrid 40. The resulting output signal at output port 46 is:

$$-\frac{ja_1}{2}e^{-j\phi} + \frac{a_2}{2}e^{-j\phi} + \frac{-ja_1}{2}e^{j\phi} + \frac{(-j)^2 a_2}{2}e^{j\phi} = -j\frac{a_1}{2}(e^{-j\phi} + e^{j\phi}) +$$
$$\frac{a_2}{2}(e^{-j\phi} - e^{j\phi})$$
$$= -j(a_1\cos\phi + a_2\sin\phi)$$

And the resulting output signal at port 48 is:

$$\frac{a_1}{2}e^{j\phi} + \frac{ja_2}{2}e^{j\phi} + \frac{(-j)^2 a_1}{2}e^{-j\phi} - \frac{ja_2}{2}e^{-j\phi} = \frac{a_1}{2}(e^{j\phi} + e^{-j\phi}) -$$
$$\frac{ja_2}{2}(e^{j\phi} + e^{-j\phi})$$
$$= -j(-a_1\sin\phi + a_2\cos\phi)$$

where $a_1$ and $a_2$ are the input signals supplied to first hybrid 10, $a_1^{out}$ and $a_2^{out}$ are the output signals provided by second hybrid 40, and where $\phi$ is the phase shift introduced in the phase shifters.

When the output signals are multiplied by $-j$, which is equivalent to a 90 degree phase shift, then the outputs have the usual form of a unitary transformation.

$$\begin{pmatrix} a_1^{out} \\ a_2^{out} \end{pmatrix} = \begin{pmatrix} \cos\phi & \sin\phi \\ -\sin\phi & \cos\phi \end{pmatrix} \begin{pmatrix} a_1 \\ a_2 \end{pmatrix}$$

This power diverter circuit is impedance matched on all ports, and the power is conserved therefore no degradation of noise figure is introduced. The power diverter circuit is also linear and reciprocal. The power diverter circuit utilizes only linear components therefore no spurious signals are introduced. The phase shift $\phi$ can be selected to cancel signals at one output and direct all the energy to the other output. The described circuit can be used in a power diverter in an interference canceller. While the circuit is shown and described for a two signal system, multiple circuits can be cascaded to provide a nulling system with more than two channels.

Figure 2:
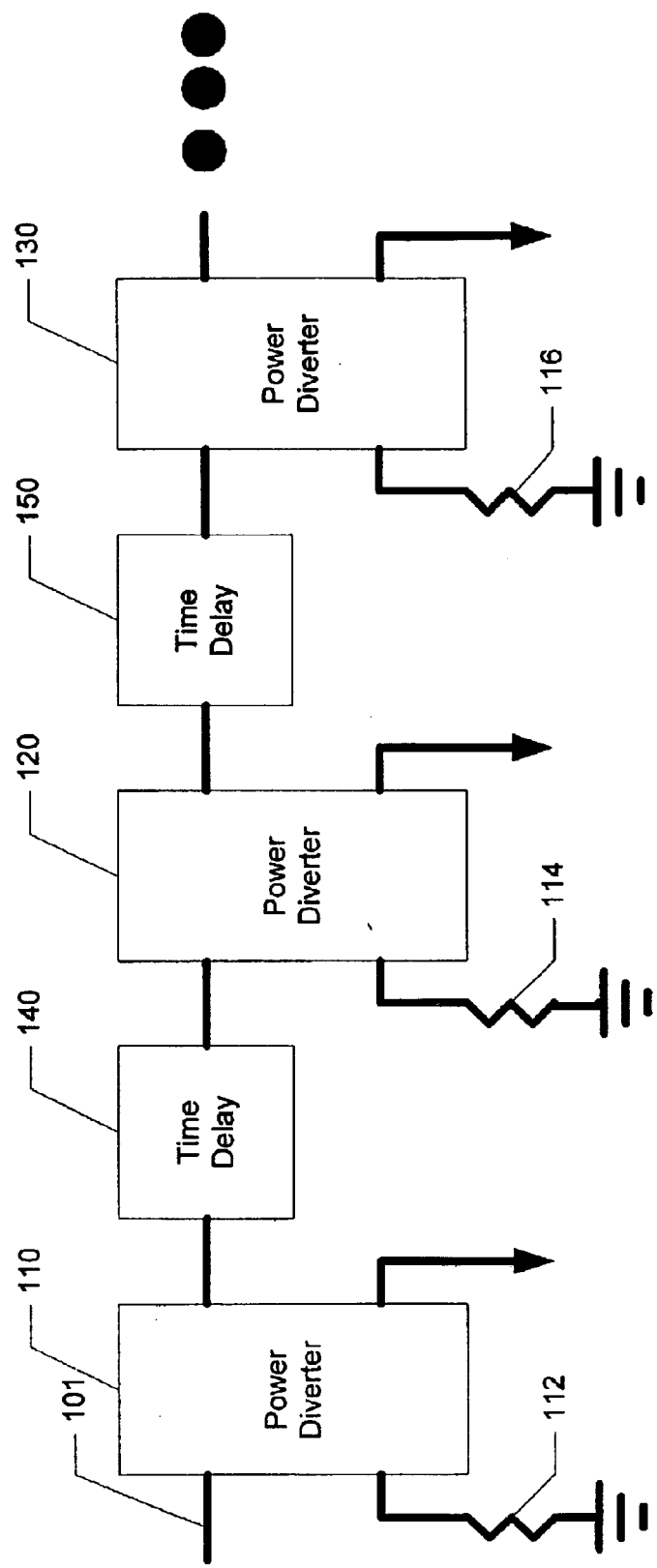
FIG. 2 is a block diagram of the power diverter of the present invention configured as a programmable tap for a delay line.

Referring now to FIG. 2, an arrangement 100 wherein the power diverter is utilized as a programmable tap for a delay line is shown. The delay line 101 is supplied to the $a_1$ input port of power diverter 110. The $a_2$ input is terminated by an impedance 112 whose value is the characteristic impedance of the system so as to prevent reflections. The $a_1^{out}$ output is then $-ja_1\cos\phi$ and the $a_2^{out}$ output is $ja_1\sin\phi$. As shown in FIG. 2, multiple power diverters (120, 130), each with one input terminated (impedance 114, 116), can be cascaded with multiple time delay elements (140, 150) to provide a desired number of programmable taps from the delay line.

Having described preferred embodiments of the invention it will now become apparent to those of ordinary skill in the art that other embodiments incorporating these concepts may be used. Accordingly, it is submitted that that the invention should not be limited to the described embodiments but rather should be limited only by the spirit and scope of the appended claims. All publications and references cited herein are expressly incorporated herein by reference in their entirety.

What is claimed is:

1. A power diverter comprising:
   a first ninety degree hybrid having a first input port, a second input port, a first output port and a second output port;
   a first phase shifter providing a positive phase shift and having an input port coupled to the first output port of said first hybrid;
   a second phase shifter providing a negative phase shift and having an input port coupled to the second output port of said first hybrid; and
   a second ninety degree hybrid having a first input port coupled to an output port of said first phase shifter, a second input port coupled to an output port of said second phase shifter, a first output port, and a second output port and wherein the absolute value of the phase shift provided by said first phase shifter and said second phase shifter is the same.

2. The power diverter of claim 1 wherein a first output signal of said second hybrid is related to a first input signal of said first hybrid and to a second input signal of said first hybrid by the equation $-j(a_1\cos\phi+a_2\sin\phi)$ and wherein a second output signal of said second hybrid is related to said first input signal of said first hybrid and to said second input signal of said first hybrid by the equation $-j(-a_1\sin\phi+a_2\cos\phi)$, where $a_1$ is the signal supplied to said first input port of said first ninety degree hybrid, $a_2$ is the signal supplied to said second input port of said first ninety degree hybrid, and $|\phi|$ is the phase shift introduced by said first phase shifter and said second phase shifter.

3. The power diverter of claim 1 wherein at least one of said first phase shifter and said second phase shifter provide adjustable phase shift.

4. The power diverter of claim 1 wherein said first input port of said first ninety degree hybrid, said second input port of said first ninety degree hybrid, said first output port of said second ninety degree hybrid, and said second output port of said second ninety degree hybrid are impedance matched.

5. The power diverter of claim 1 wherein said converter is comprised of only linear components.

6. The power diverter of claim 1 further comprising additional power diverters which are cascaded to provide a multiple channel device.

7. The power diverter of claim 1 wherein one of said first input port and said second input port is terminated and said power diverter functions as an adjustable tap of a tapped delay line.

8. A delay line having programmable taps comprising:

a delay line, a first programmable tap comprising a power diverter having a first input coupled to said delay line, a second input which is terminated, and an output; and a time delay element coupled to said first programmable tap output.

9. The delay line of claim 8 further comprising at least one additional programmable tap and at least one additional time delay element, each of said at least one delay element having an input coupled to an output of a programmable tap, each of said at least one additional delay element having an output coupled to an input of said programmable tap.

* * * * *

UNITED STATES PATENT AND TRADEMARK OFFICE
CERTIFICATE OF CORRECTION

PATENT NO. : 6,781,855 B1  
DATED : August 24, 2004  
INVENTOR(S) : Oates

Page 1 of 1

It is certified that error appears in the above-identified patent and that said Letters Patent is hereby corrected as shown below:

Column 3,  
Line 53, delete "$\dfrac{a_1}{2}e^{j\phi} + \dfrac{ja_2}{2}e^{j\phi} + \dfrac{(-j)^2 a_1}{2}e^{-j\phi} - \dfrac{ja_2}{2}e^{-j\phi} = \dfrac{a_1}{2}(e^{j\phi} + e^{-j\phi}) - \dfrac{ja_2}{2}(e^{j\phi} + e^{-j\phi})$"

and replace it with

-- $\dfrac{a_1}{2}e^{j\phi} - \dfrac{ja_2}{2}e^{j\phi} + \dfrac{(-j)^2 a_1}{2}e^{-j\phi} - \dfrac{ja_2}{2}e^{-j\phi} = \dfrac{a_1}{2}(e^{j\phi} - e^{-j\phi}) - \dfrac{ja_2}{2}(e^{j\phi} + e^{-j\phi})$ --.

Column 4,  
Line 29, delete "invention" and replace it with -- invention, --.  
Line 32, delete the second occurrence of "that".

Column 6,  
Line 2 delete "line," and replace it with -- line; --.

Signed and Sealed this

Twenty-third Day of May, 2006

JON W. DUDAS  
*Director of the United States Patent and Trademark Office*